United States Patent
Chen et al.

(10) Patent No.: US 11,147,196 B1
(45) Date of Patent: Oct. 12, 2021

(54) AIR DUCT WITH EMI SUPPRESSION

(71) Applicant: QUANTA COMPUTER INC., Taoyuan (TW)

(72) Inventors: Ching-Jen Chen, Taoyuan (TW); Cheng-Hsien Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/839,625

(22) Filed: Apr. 3, 2020

(51) Int. Cl.
- *H05K 9/00* (2006.01)
- *H01Q 17/00* (2006.01)
- *H05K 7/14* (2006.01)
- *H05K 7/20* (2006.01)

(52) U.S. Cl.
CPC ......... *H05K 9/0041* (2013.01); *H01Q 17/004* (2013.01); *H01Q 17/008* (2013.01); *H05K 7/1487* (2013.01); *H05K 7/20009* (2013.01); *H05K 7/20709* (2013.01)

(58) Field of Classification Search
CPC .............. H05K 9/0041; H05K 7/1487; H05K 7/20009; H05K 7/20709; H01Q 17/004; H01Q 17/008
See application file for complete search history.

(56) References Cited

U.S. PATENT DOCUMENTS

| | | | | |
|---|---|---|---|---|
| 6,919,387 B2* | 7/2005 | Fujieda | ............... | H05K 1/0233 523/137 |
| 6,972,097 B2* | 12/2005 | Yoshida | ................... | H01F 1/22 252/62.54 |
| 8,295,786 B2* | 10/2012 | Aramaki | ................... | H01F 1/26 455/90.3 |
| 9,717,169 B2* | 7/2017 | Bodette | ...................... | G06F 1/20 |
| 10,108,232 B2* | 10/2018 | Nicol | ....................... | G06F 1/182 |
| 2007/0196671 A1* | 8/2007 | Kobayashi | ............. | B82Y 25/00 428/447 |
| 2013/0277010 A1* | 10/2013 | Lin | ........................... | G06F 1/20 165/80.2 |
| 2020/0258666 A1* | 8/2020 | Kou | ........................ | H01F 1/153 |

* cited by examiner

*Primary Examiner* — Mukundbhai G Patel
(74) *Attorney, Agent, or Firm* — Nixon Peabody LLP

(57) ABSTRACT

An air duct formed from an electromagnetic wave absorber in the form of a sheet is disclosed. The sheet can be bent into a duct or scored, and folded at the score lines to bring the ends of the sheet into proximity. The ends can then be joined by adhesive, welding, or mechanical fasters. The air ducts disclosed herein provide dual functions of providing ventilation for electronic components in an electronic module, while at the same time, reducing electromagnetic interference (EMI). One or more air ducts, of the same or different dimensions, shapes, volumes can be combined with electronic modules, such as a server, to provide both ventilation and EMI suppression to various components within the electronic module.

14 Claims, 3 Drawing Sheets

AIR DUCT WITH EMI SUPPRESSION

FIELD OF THE INVENTION

This disclosure relates to air ducts for ventilating electronic devices, where the air ducts have dual functioning properties. Air ducts are commonly used for ventilating electronic devices, such as electronic components in a chassis. The present disclosure provides for ventilating electronic devices, while at the same time, suppressing electromagnetic interference ("EMI") in a wide frequency range.

BACKGROUND

U.S. published application 20030202326 A1, entitled "Electromagnetic interference reduction air duct" describes an air duct for ventilating an electronic device having a processor. The air duct comprises one or more walls that have an irregular surface and that further have a layer of conductive material applied to the irregular surface. Further embodiments of this disclosure include electronic device enclosures and electronic devices having an air duct featuring an irregular interior surface, and having conductive material applied to the irregular surface. In other words, a conductive paint converts the air duct into a parallel waveguide. The air duct generally has a "cut-off frequency," where electromagnetic waves with a frequency that is lower than the cut-off frequency will not propagate at all. Thus, the wave with a frequency lower than the cut-off frequency will cause exponential attenuation (electromagnetic interference reduction) that is dependent upon the length of the guide.

The drawback of this previous approach is that the cut-off frequency depends upon the size of the air duct. Thus, this waveguide is only used for microwave frequencies. For lower frequencies, the size of the air duct is not within normal dimensions to function as a ventilating device for electronic components.

Recently introduced electromagnetic absorbing products can provide a relatively easy solution for reducing unwanted radio frequency ("RF") noise. These sheet-type absorbing products are a composite material with magnetic particles embedded in a polymer. They have good noise attenuation properties from hundreds of MHz to several GHz. These materials have unique electromagnetic and physical properties.

JP-A-2002-329995 discloses a laminated electromagnetic wave absorber composed of an electromagnetic wave reflection layer coated, at least on one side, with an electromagnetic wave absorption layer. The reflection layer comprises an electroconductive filler dispersed in a silicone resin, and the absorption layer comprises an electromagnetic wave absorbing filler dispersed in a silicone resin. It is claimed to have high electromagnetic wave absorbing and shielding capacities, and at the same time, high moldability and flexibility. Weather resistance and heat resistance are attributable to the silicone resin itself. JP-A-11-335472 discloses a sheet of electromagnetic wave absorbing, thermoconductive, silicone gel composition containing magnetic particles of metal oxide (e.g., ferrite), and a thermoconductive filler (of metal oxide or the like).

JP-A-2000-342615 discloses a method for producing a composite magnetic film of flat, soft magnetic powder slurried with a binder and solvent. However, it is difficult for this method to have a film of high, flat, soft magnetic powder content. Therefore, this film cannot be expected to have a high permeability at a high frequency of 1 GHz or more.

JP-A-2001-294752 and JP-A-2001-119189 disclose a curable silicone composition which allows a soft, magnetic material to be well formed even when it contains a soft, magnetic powder at a high content to have excellent electromagnetic wave absorption characteristics. These compositions, however, involve problems of insufficient soft, magnetic particle content and moldability. JP-A-2002-15905 discloses a composite magnetic material for absorbing electromagnetic waves. The composite magnetic material contains a flat, soft magnetic powder having an aspect ratio of 20 or more, ferrite powder having a particle size of 100 μm or less and resin binder, where the magnetic powder has a well-balanced complex permeability and complex dielectric constant to realize efficient conversion of noise into heat energy at a high frequency.

U.S. published application 20070196671 A1 discloses several embodiments of wave absorbers. In one embodiment, the wave absorber comprises: (a) soft ferrite having its surface treated with a silane compound having no functional group, (b) flat, soft magnetic metal powder, (c) magnetite, and (d) silicone. In another embodiment, it omits (b) the flat, soft magnetic powder and comprises only (a) soft ferrite having its surface treated with a silane compound having no functional group, (c) magnetite and (d) silicone. In either embodiment, the electromagnetic wave absorbers are said to excel in electromagnetic wave absorption, heat conduction and flame resistance, exhibiting less temperature dependence, and which electromagnetic wave absorber is soft, excelling in adhesion strength and further excelling in high resistance, high insulation properties and in energy conversion efficiency being stable in MHz to 10 GHz broadband frequency. Each of the foregoing prior art disclosures is herein incorporated by reference in their entirety.

SUMMARY

The term "embodiment" and like terms used herein are intended to refer broadly to all the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the specification of this disclosure, any or all drawings, and each claim.

Because of the varied and emerging requirements for air ducts for electronic modules, we contemplate that our disclosure can provide the following:

In one embodiment, we provide an air duct capable of the dual purposes of ventilating an electronic device and reducing electromagnetic interference (EMI). The air duct comprises at least one wall formed of an electromagnetic wave absorber.

In another embodiment, the at least one wall further comprises a flat, soft magnetic powder.

In a still further embodiment, the air duct comprising multiple walls formed of an electromagnetic wave absorber comprising a soft ferrite treated with a silane having no functional group, magnetite, and silicon.

In another embodiment, the at least one wall can absorb over a broad frequency range of 50 MHz to 10 GHz.

In another embodiment, the at least one wall comprises a thickness in the range of 0.10 mm to 0.50 mm.

It is a still further embodiment to provide a plurality of electronic devices within a single module, such as a server or chassis, where the ventilation of the electronic devices is provided by one or more air ducts having the 2-in-1 functional properties as described above.

In one embodiment, we describe a combination of the air duct as described above, and an electronic module, wherein the electronic module comprises at least a central processing unit (CPU).

In another embodiment, the electronic module comprises at least a central processing unit (CPU) and at least one other electronic component.

In a still further embodiment, the electronic module comprises at least a central processing unit (CPU), wherein a plurality of air ducts as described above are provided.

In a still further embodiment, at least one of the air ducts in the plurality of air ducts differs from another air duct in at least one of size, shape, and volumetric flow.

It is a further embodiment of this disclosure to utilize an EMI absorber sheet to make an air duct, where the performance advantage comes from dual (2-in-1) functional properties of ventilating an electronic device and EMI suppression in a wide frequency range, and further, where the size of the air duct is flexible to meet thermal dissipation requirements of different electronic devices.

The above summary is not intended to represent every embodiment or every aspect of the present disclosure. Rather, the foregoing summary merely provides examples of some of the novel aspects and features set forth herein. The above features and advantages, and other features and advantages of the present disclosure will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiment, and are therefore not to be considered as limitations on the scope of the various embodiments or claims.

Figure 1:
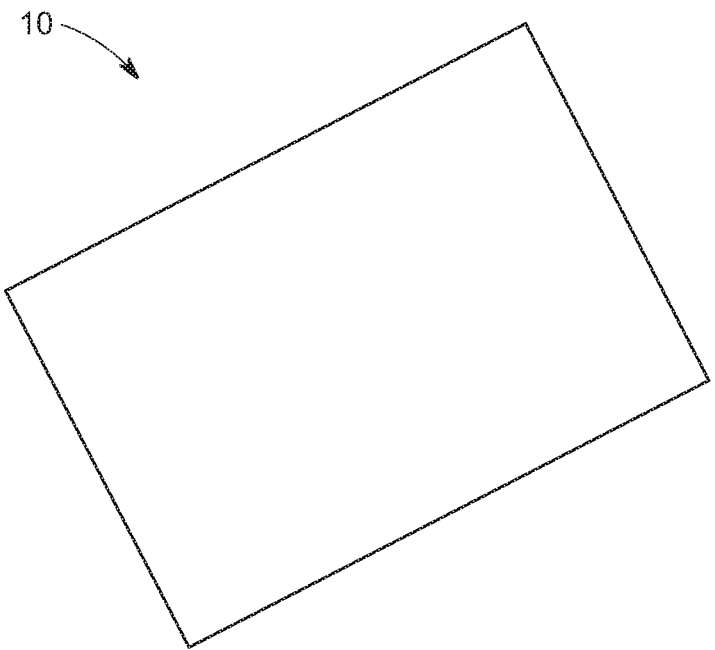
FIG. 1 is a schematic representation of an EMI absorber sheet blank.

The present disclosure is susceptible to various modifications and alternative forms. Some representative embodiments have been shown by way of example herein. It should be understood however, that the disclosure is not intended to be limited to the particular forms illustrated. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. These embodiments are examples or illustrations of the principles of the disclosure but are not intended to limit its broad aspects. To that extent, elements and limitations that are disclosed, for example, in the Abstract, Summary and Detailed Description sections, but not explicitly set forth in the claims, should not be incorporated into the claims, singly or collectively, by implication, inference, or otherwise. For purposes of the present detailed description, unless otherwise specifically disclaimed, the singular includes the plural and vice versa, and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof. Like elements in various views of the drawings are given the same numerical identifier.

An EMI absorber sheet 10 before being shaped into an air duct is illustrated schematically in FIG. 1. The EMI absorber sheet 10 can be formed in various ways, or even purchased commercially. In one embodiment, the EMI absorber sheet 10 comprises a soft ferrite having its surface treated with a silane compound having no functional group, magnetite, and silicone. In another embodiment, the EMI absorber sheet 10 can comprise a soft ferrite having its surface treated with a silane compound having no functional group, flat, soft magnetic powder, magnetite, and silicone. For example, the EMI absorber sheet 10 may be curved about itself, and fastened at its adjacent edges to form a tubular air duct having a singular wall, such as an air duct of tubular cross-section. In such an embodiment, the air duct can be said to comprise only a single wall. However, in preferred embodiments, the EMI absorber sheet 10 can be formed into a conduit shape comprising a plurality of walls.

Figure 2:
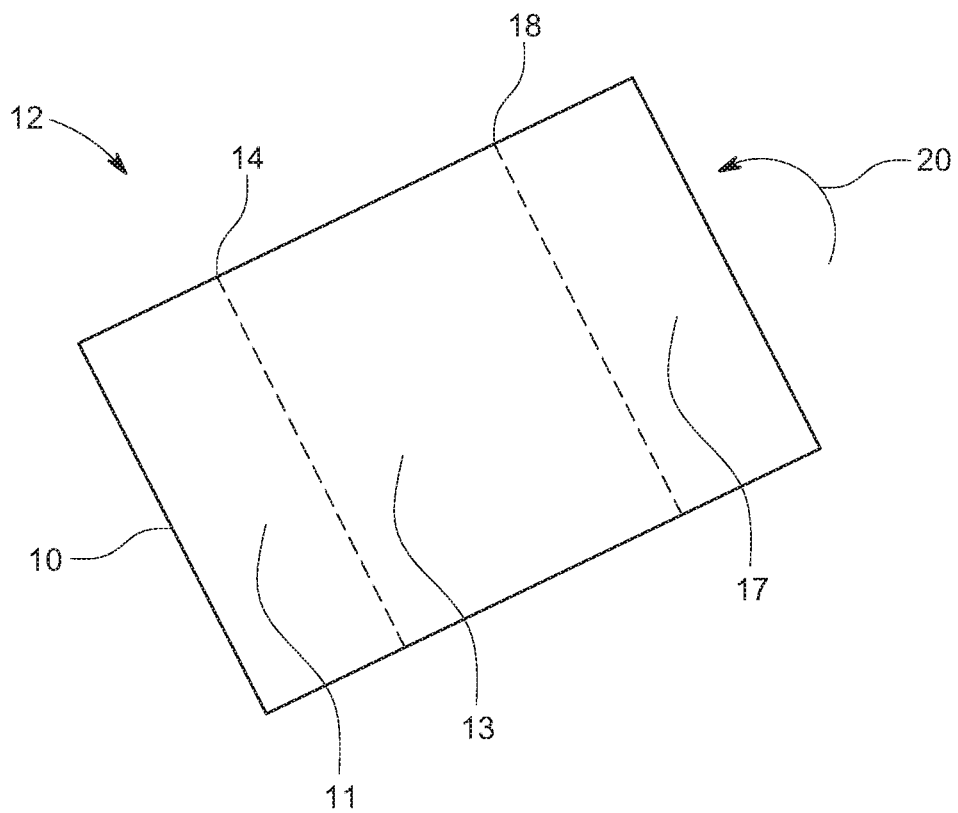
FIG. 2 is a schematic representation of the EMI absorber sheet blank of FIG. 1 with score lines to facilitate folding of the blank into a quadrilateral shaped air duct.

As shown in FIG. 2, the EMI absorber sheet 10 can be formed into an air duct by providing a series of score lines 14, 18 to assist in converting the EMI absorber sheet 10 into a pre-folded, scored EMI absorber sheet 12. The scored EMI absorber sheet 12 is formed into sections 11, 13 and 17, as defined by the score lines 14, 18. These sections 11, 13 and 17 will then define the shape of the air duct.

Figure 3:
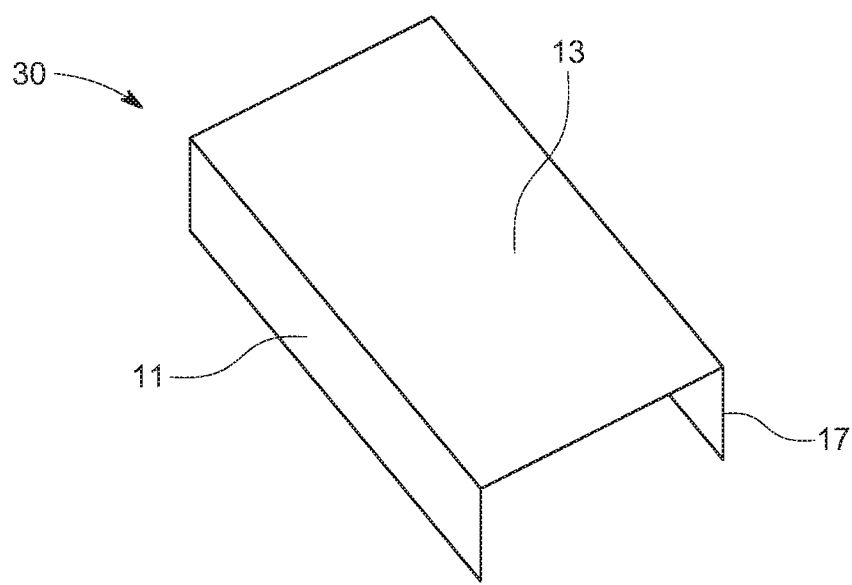
FIG. 3 is a schematic representation of an air duct formed by folding along the score lines of FIG. 2.

The scored EMI absorber sheet 12 can then be folded in the direction of arrow 20 to form an air duct 30, as shown in FIG. 3. Section 13 form the top wall of air duct 30, while sections 17 and 11 form the left and right side walls of air duct 30. The adjacent edges of sections 17 and 11 can be joined at their intersection 32 by gluing, welding, mechanical fasteners, or other means known in the art. Also, as shown in FIG. 3, the number, size and shape of the sections will determine the number of walls and ultimate shape of air duct 30. In this example, there are three rectangular sections 11, 13 and 17 that form three linear walls for the air duct 30. The walls of the air duct formed by the EMI absorber sheet blank 10 may also be a non-linear shape (e.g., curvilinear), such as a single wall forming a pipe-like structure. In other embodiments of this disclosure, the EMI absorber sheet 10 (in FIG. 1) can be scored in two, three, four, five, six seven, eight, nine, or more times to form a multi-walled shape. Examples of the cross-sectional shapes of air ducts so formed upon folding on the score lines include a triangle, a quadrilateral, a pentagon, a hexagon, a heptagon, an octagon, a nonagon, a decagon, etc. The quadrilaterals can include square, rectangular, parallelogram, trapezoid, isosceles trapezoid, kite and rhombus cross sections, among others. It should be understood however, that all the foregoing embodiments are exemplary and not limiting of the shape of air duct 30. By the use of curved score lines, or by combining straight and curved score lines, various non-linear air duct shapes may be achieved, including those with only two walls.

Alternatively, the air duct may be formed from individual pieces of an EMI absorber sheet similar to the EMI absorber sheet 10 in FIG. 1, where individual pieces are fastened together to form the air duct. Fastening can be achieved in various manners, such as by gluing, welding, stapling, clipping, and other manners of joining the pieces together. When utilizing individual pieces, rather than folded blanks, the shape, size and interior volumes of air ducts can be freely designed to accommodate the ventilating requirements of the air duct. Even the fitting of the air duct within the confines of an electronic device or module, such as a server, can be accommodated.

The present disclosure also contemplates the formation of multiple air ducts within a single electronic device, such as a server. Because electronic devices may vary in the cooling requirements, air flow volumes and other characteristics unique to electronic apparatus construction and or configuration, the multiple air ducts may or may not be of the same shape, size, air flow capacity, etc.

Figure 4:
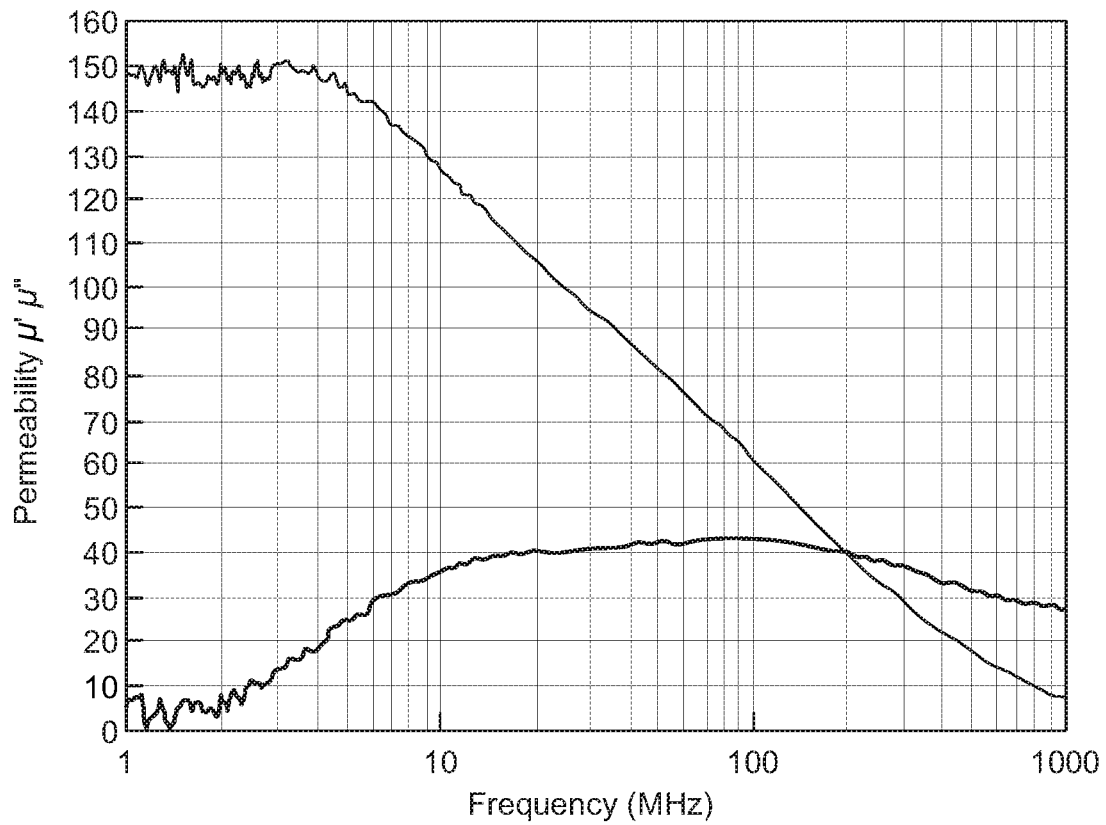
FIG. 4 is a graphical representation of permeability, where µ=150 (at 1 MHz) as the ordinate plotted against frequency as the abscissa.

In one embodiment, using CA150-030 absorber sheet to make an air duct, the absorber thickness is 0.30 mm, permeability $\mu'=150$ (at 1 MHz) as is shown in FIG. 4. The permeability is complex and is generally written as $\mu=\mu'-j\mu''$. The real ($\mu'$) and imaginary parts ($\mu''$) represent magnetic storage and magnetic losses, respectively. Performance advantages come from the dual (2 in 1) functional properties when absorber sheet 10 is used for ventilating an electronic device, as well as for EMI suppression. FIG. 4 is a graphical representation of permeability of a CA150-030 sheet used to make an air duct. The effect of frequency can be seen in the graphical representation of FIG. 4 where the frequency (MHz) on the abscissa is plotted against the permeability (on the ordinate) of the graph.

Figure 5:
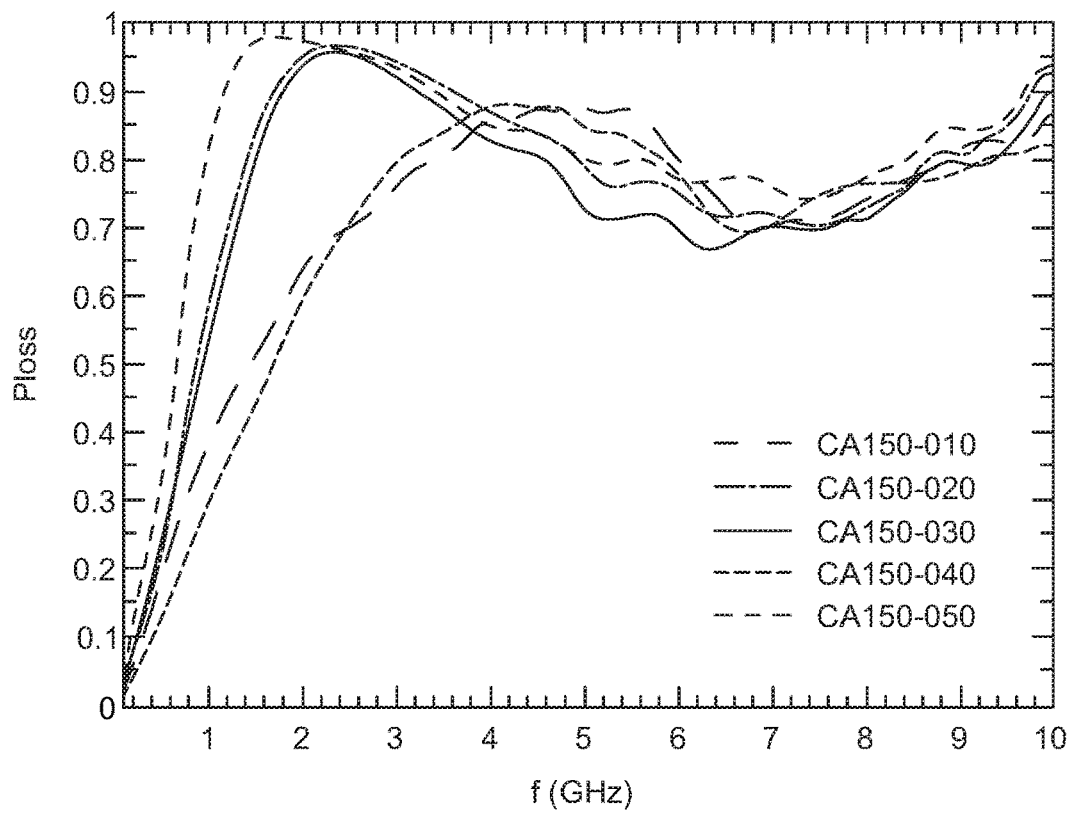
FIG. 5 is a graphic representation of typical power loss change as the ordinate plotted against frequency (GHz) for various thicknesses.

The EMI absorber sheet 10 can be of various thicknesses. For example, the EMI absorber sheet 10 can have a thickness in the range of 0.10 mm to 0.50 mm, in varying 0.10 mm increments. For example, the EMI absorber sheet 10 can have a thickness selected from 0.10 mm, 0.20 mm, 0.30 mm, 0.40 mm and 0.50 mm. In FIG. 5, typical power loss change is plotted versus frequency for various thicknesses of absorbers. EMI absorbing performance over a broad range of frequency range of 50 MHz to 10 GHz, and more, is possible. For example, CA150-030 is an absorber having a thickness 0.30 mm, and CA150-050 is an absorber having a thickness of 0.50 mm, respectively. Power loss changes with thickness of absorber sheet, as well as the frequency. Graphical results are shown in FIG. 5 for a range of frequencies of 50 MHz to 10 GHz, for various absorbers, such as CA150-010, CA150-020, CA150-030, CA150-040 and CA150-050.

The graphical representations of power loss are seen in FIG. 5, where the frequency range (50 MHz to 10 GHZ) is plotted on the abscissa for absorber sheets of varying thicknesses of 0.10 mm, 0.20 mm, 0.30 mm, 0.40 mm and 0.50 mm, respectively. The permeability and power loss changes can be modified by changing the amount, and/or, relative proportions of the various constituents used in EMI absorber sheet 10.

Figure 6:
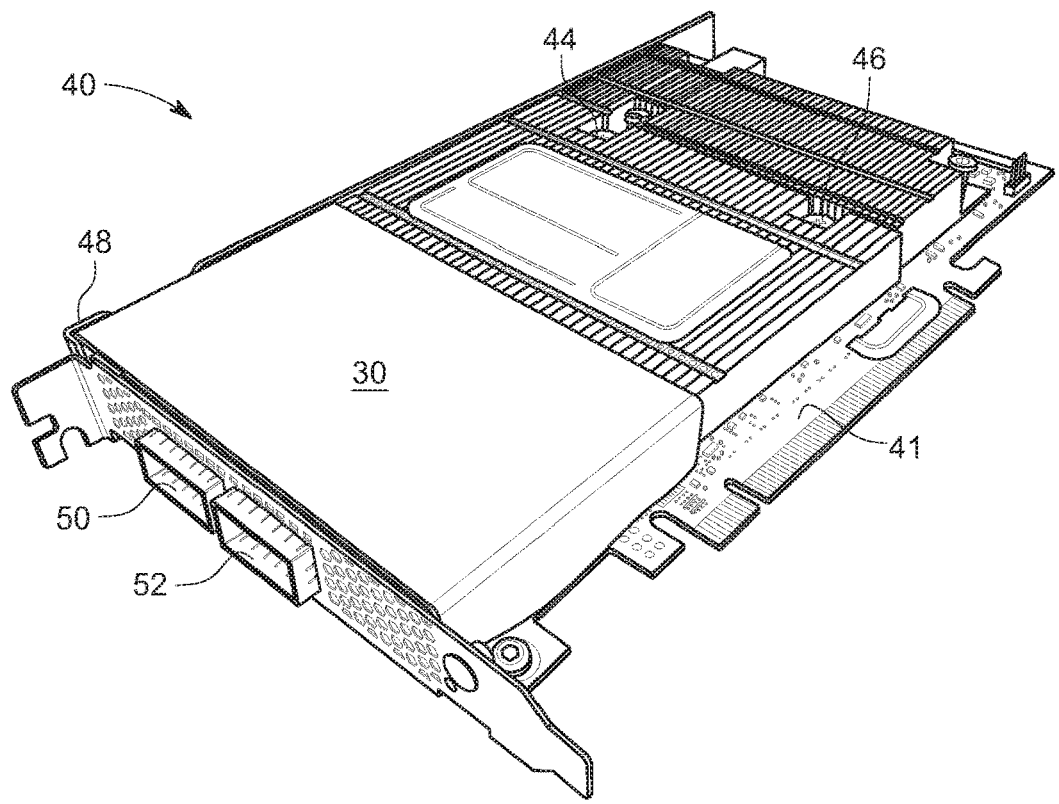
FIG. 6 is a schematic, perspective view of an air duct, according to one embodiment of the disclosure in combination with at least one electronic device for use in a single chassis (not shown).

FIG. 6 shows an environment where the dual (2 in 1) function of air ducts made according to the present disclosure can be utilized. FIG. 6 shows an electronic module 40, comprising a printed circuit board ("PCB") 41 in combination with one or more electronic devices 44, 46. Devices 44, 46, may be independently chosen from a central control unit ("CPU"), a power supply, a graphics card, and other electronic components typically found in servers. The devices 44, 46 are carried by a chassis 48. In the embodiment of FIG. 6, two air ducts 50, 52 are utilized to supplying ventilation, such as cooling air, to the various electronic components within electronic module 40. These air ducts 50, 52 can be the (2 in 1) function air ducts 30 previously described as providing both ventilation and EMI suppression to the components within the electronic module 40. Because the design of electronic modules is in a constant state of flux, applicant has only exemplified a single current form of electronic module 40. However, processing speeds and requirements are rapidly improving for such electronic modules. The present disclosure is designed to meet both current and future needs for ventilating such electronic modules. Higher processing speeds generally result in higher power requirements and greater need for ventilation. Because not all electronic components within a single electronic module require the same amount, or degree, of ventilation, it is envisioned that multiple air ducts of various shapes, sizes, air flow and EMI suppression specifications will likely exist within a single electronic module. The present disclosure contemplates the provision of air ducts to meet all such requirements.

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

Although the invention has been illustrated and described with respect to one or more implementations, equivalents, alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

We claim:

1. An air duct capable of both ventilating an electronic device and reducing electromagnetic interference (EMI) to the electronic device; the air duct comprising at least one wall consisting of an electromagnetic interference (EMI) wave absorber sheet; the sheet comprising a soft ferrite having its surface treated with a silane with no functional group, magnetite and silicone and further comprising flat, soft magnetic powder; and the sheet configured to absorb radio frequency waves so as to reduce electromagnetic interference (EMI); wherein the electromagnetic interference (EMI) wave absorber has a permeability ($\mu'$) where $\mu'=150$ (at 1 MHz); wherein the electromagnetic interference (EMI) wave absorber sheet further comprises a plurality of score lines, and the sheet is folded at the score lines to form the air duct and wherein the at least one wall consisting of the electromagnetic interference (EMI) sheet is configured as part of a conduit to convey ventilating air to the electronic device.

2. The air duct of claim 1, further comprising a plurality of walls formed of the electromagnetic wave absorber.

3. The air duct of claim 1, wherein the at least one wall can absorb over a radio frequency range of 50 MHz to 10 GHz.

4. The air duct of claim 1, wherein the at least one wall comprises a thickness in the range of 0.10 mm to 0.50 mm.

5. A combination of the air duct of claim 1, and an electronic module, wherein the electronic module comprises at least a central processing unit (CPU).

6. The combination of claim 5, comprising at least one other electronic component.

7. The air duct of claim 1, where the air duct comprises a single wall wherein the electromagnetic interference (EMI) wave absorber sheet has two ends which are brought into proximity and joined.

8. The air duct of claim 7, wherein the two ends are joined by at least one selected from the group consisting of an adhesive, welding, and mechanical fasteners.

9. The air duct of claim 1, wherein the at least one wall is a non-linear shape.

10. The air duct of claim 1, wherein the at least one wall is assembled from a plurality of different pieces of an electromagnetic wave absorber whose pieces are joined together to form the air duct.

11. A combination of the air duct of claim 1, and an electronic module comprising at least a central processing unit (CPU).

12. The combination of claim 11, comprising at least one other electronic component other than the central processing unit (CPU).

13. The combination of claim 12, comprising multiple air ducts.

14. The combination of claim 13, wherein at least one air duct of the multiple air ducts, differs in at least one category selected from the group consisting of size, shape, and volumetric flow, from at least one other air duct of the multiple air ducts.

* * * * *